United States Patent [19]

Abernathy et al.

[11] Patent Number: 5,227,006
[45] Date of Patent: Jul. 13, 1993

[54] METHOD FOR SELECTIVELY GROWING GALLIUM-CONTAINING LAYERS

[75] Inventors: Cammy R. Abernathy, Scotch Plains; Stephen J. Pearton, Summit; Fan Ren, Warren; Patrick W. Wisk, Greenbrook, all of N.J.

[73] Assignee: AT&T Bell Laboratories, Murray Hill, N.J.

[21] Appl. No.: 799,269

[22] Filed: Nov. 27, 1991

[51] Int. Cl.$^5$ .............................................. C30B 25/04
[52] U.S. Cl. .................................. 156/613; 156/610; 156/611; 156/DIG. 70; 156/DIG. 103; 437/126; 437/133
[58] Field of Search ............... 156/610, 611, 613, 614, 156/DIG. 70, DIG. 103; 437/126, 133

[56] References Cited

U.S. PATENT DOCUMENTS

| | | | |
|---|---|---|---|
| 4,171,234 | 10/1979 | Nagata et al. | 156/DIG. 103 |
| 4,636,268 | 1/1987 | Tsang | 156/DIG. 103 |
| 4,637,129 | 1/1987 | Derkits et al. | 156/DIG. 103 |
| 4,878,989 | 11/1989 | Purdes | 156/DIG. 103 |
| 5,025,751 | 6/1991 | Takatani et al. | 156/DIG. 103 |
| 5,124,278 | 6/1992 | Bohling et al. | 156/610 |

OTHER PUBLICATIONS

Brauers, "Alternative Precursors for III-V MOVPE Criteria for Evaluation", Journal of Crystal Growth, vol. 107 (1991) pp. 281-289.

Hamaoka et al, "Mass Spectrometric Study and Modeling of Decomposition Process of Tris-Dimethylamino-Arsenic on (001) GaAs Surface", Jap. Jour. of Appl. Physics vol. 30, No. 9A Sep. 1991 pp. L1519 to L1582.

G. J. Davies, et al. "Metal-organic molecular beam epitaxy (MOMBE)" *Chemtronics*, vol. 3, pp. 3-16 (1988).

W. T. Tsang, "The Growth of GaAs, AlGaAs, InP and InGaAs by Chemical Beam Epitaxy Using Group III and V Alkyls", *Journal of Electronic Materials*, pp. 235-245 (1986).

T. Koui, et al. "Metal-Organic Molecular-Beam Epitaxy with a New Arsenic Precursor As[N(CH$_3$)$_2$]$_3$: Characterization of the Decomposition Processes and Growth of GaAs", *Extended Abstracts of the 1991 International Conference on Solid State Devices and Materials*, pp. 408-410 (1991).

T. Takahashi, et al. "Carbon-Doped-Base AlGaAs/GaAs HBTs Grown by Gas-Source MBE Using Only Gaseous Sources", Extended Abstracts of the 1991 *International Conference on Solid State Devices and Materials*, pp. 359-361, (1991).

*Primary Examiner*—Robert Kunemund
*Attorney, Agent, or Firm*—Glen E. Books

[57] ABSTRACT

In accordance with the invention, gallium-containing layers are grown by molecular beam processes using as an arsenic precursor a compound of the dialkylaminoarsenic family (DAAAs) such as tris-dimethylamino arsenic (DMAAs). In contrast to conventional arsenic sources, DAAAs act as carbon "getters". When DAAAs are used as an arsenic source, the DAAAs getter carbon impurities from the gallium source. Thus, for example, DAAAs can be used as an arsenic source in combination with TMG as a gallium source to selectively grow high purity or n-type layers of gallium arsenide at low temperatures below 600° C. In addition DMAAs has been found to be an excellent cleaning agent for gallium arsenide materials.

4 Claims, 2 Drawing Sheets

METHOD FOR SELECTIVELY GROWING GALLIUM-CONTAINING LAYERS

FIELD OF THE INVENTION

This invention relates to methods for fabricating gallium arsenide semiconductor devices and, in particular, to methods for selectively growing gallium-containing layers.

BACKGROUND OF THE INVENTION

Because of their high speeds and direct bandgap capabilities, gallium arsenide devices offer considerable promise for use as high speed electronic and photonic devices and integrated circuits. Such devices typically comprise a plurality of layers of gallium arsenide and aluminum gallium arsenide which are doped to n or p type conductivity and configured to operate as semiconductor electronic devices such as bipolar or field effect transistors or as photonic devices such as photodetectors or surface emitting lasers.

A preferred method of fabricating a gallium arsenide layered structure is molecular beam epitaxy such as the process of metalorganic molecular beam epitaxy (MOMBE) described by G. J. Davies et al, 3 *Chemtronics* 3 (1988). Other molecular beam processes are described by W. T. Tsang, *Journal of Electronic Materials*, p. 235 (1986).

In essence a molecular beam process involves disposing a substrate within a low pressure growth chamber, heating the substrate and directing onto the substrate a molecular beam of gaseous molecules which decompose to form a desired layer. Processes referred to as MBE typically use only elemental sources for the Group III, Group V, and dopant elements, whereas MOMBE processes use a wide variety of elemental and compound gaseous sources providing at least one of the Group III or dopant elements. Typical MOMBE processes used in the fabrication of pnp and npn transistors are described in the copending application and patent of C. R. Abernathy et al, Ser. No. 07/662549 and U.S. Pat. No. 5,171,704 both filed Feb. 28, 1991, and incorporated herein by reference.

One undesirable feature of prior art molecular beam processes is their use of arsine ($AsH_3$) or arsenic as a source in the growth of gallium arsenide. A number of device fabrication schemes require selective regrowth of gallium arsenide layers in unmasked limited areas of masked substrates. At desired low temperatures ($\leq 600°$ C.) regrowth using arsine or arsenic is non-selective, leading to growth not only on the unmasked substrate but also upon the mask.

Important classes of semiconductor devices require selective growth of high purity and n-type gallium arsenide layers at low temperatures below 600° C. in order to avoid deterioration of previously grown layers. Such selective growth cannot be readily achieved using conventional methods. Selective growth has been achieved using triethylgallium (TEG) as the gallium source, but TEG requires temperatures above 600° C. for selectivity. Selective growth at temperatures below 600° C. has been achieved using trimethylgallium (TMG) as the gallium source, but TMG introduces high levels of carbon which are not desirable in high purity or n-type layers. Accordingly, there is a need for improved methods for selectively growing gallium-containing layers.

SUMMARY OF THE INVENTION

In accordance with the invention, gallium-containing layers are grown by molecular beam processes using as an arsenic precursor a compound of the dialkylaminoarsenic family (DAAAs) such as tris-dimethylamino arsenic (DMAAs). In contrast to conventional arsenic sources, DAAAs act as carbon "getters". When DAAAs are used as an arsenic source, the DAAAs getter carbon impurities from the gallium source. Thus, for example, DAAAs can be used as an arsenic source in combination with TMG as a gallium source to selectively grow high purity or n-type layers of gallium arsenide at low temperatures below 600° C. In addition DMAAs has been found to be an excellent cleaning agent for gallium arsenide materials.

BRIEF DESCRIPTION OF THE DRAWINGS

The advantages, nature and various additional features of the invention will appear more fully upon consideration of the illustrative embodiments now to be described in detail in connection with the accompanying drawings. In the drawings.

It is to be understood that these drawings are for purposes of illustrating the concepts of the invention and, except for graphical illustrations, are not to scale.

DETAILED DESCRIPTION

Figure 1:
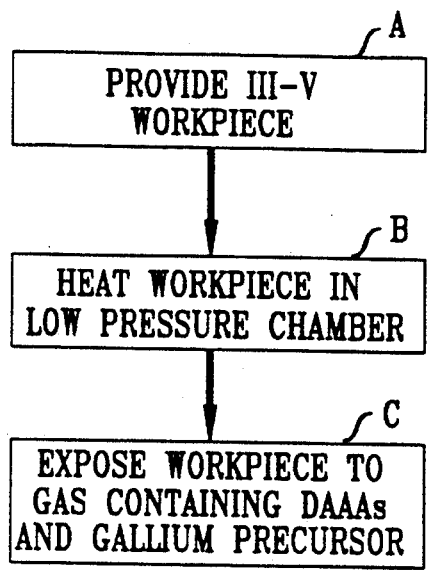
FIG. 1 is a block diagram showing the steps in growing a gallium-containing layer in accordance with the invention.
Figure 2:
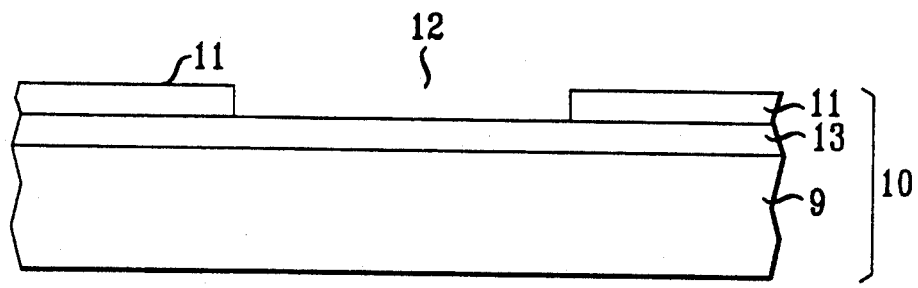
FIG. 2 is a schematic cross section of a typical workpiece upon which a layer of gallium arsenide can be grown in accordance with the invention.
Figure 3:
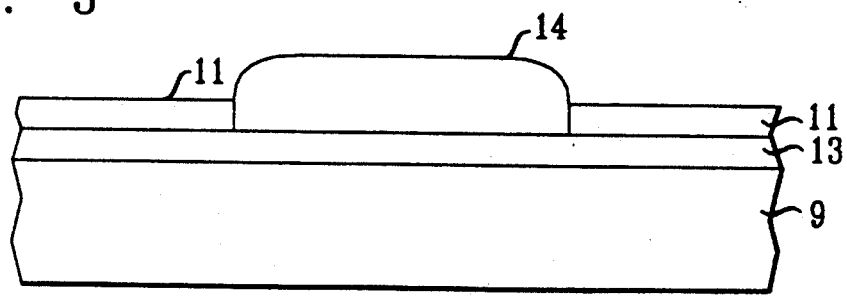
FIG. 3 shows the workpiece of FIG. 2 after growth in accordance with the invention.

Referring to the drawings, FIG. 1 illustrates the steps in growing a gallium-containing layer in accordance with the invention, and FIGS. 2 and 3 show schematic cross sections of a typical workpiece before and after the growth process of FIG. 1.

As shown in FIG. 1, block A, the first step is to provide a workpiece 10 comprising a substrate 9 having a surface layer 13 of III-V semiconductor of the gallium arsenide family.

As shown in FIG. 2 the workpiece 10 can include a masking layer 11 such as silicon nitride exposing only a predetermined area 12 of a semiconductor layer 13. Such a workpiece can be the result of several preceding steps producing a desired stack of different doped semiconductor layers (not shown) in the region beneath mask 11 and even in the region underlying layer 13. The semiconductor can be any material in the gallium arsenide family including gallium arsenide, aluminum gallium arsenide, indium gallium arsenide, aluminum arsenide, aluminum indium arsenide, or aluminum indium phosphide.

The next step shown in FIG. 1, block B is to heat the workpiece in an evacuated chamber which can be referred to as a growth chamber. The workpiece 10 is placed in a growth chamber, such as an INTEVAC Gas Source Gen II, evacuated to low pressure less than $10^{-4}$ torr and heated to a temperature less than 600° C. and preferably 500° C.–550° C. Advantageously the exposed semiconductor surface as formed, is substantially free of impurities such as residual oxides or the surface is thoroughly cleaned in accordance with techniques well known in the art.

As shown in FIG. 1, block C, the next step is exposing the semiconductor surface to gaseous molecules of dialkylaminoarsenic (DAAAs) and, at the same time, a gaseous precursor containing gallium such as trimethylgallium (TMG). DAAAs includes tris-dimethylaminoarsenic As[N(CH$_3$)$_2$]$_3$ (hereafter "DMAAs") and other compounds of the form As(NR$_2$)$_3$ where the R groupings are alkyls. DMAAs is available from Air Products and Chemicals, Inc., Allentown, PA. Preferably the DMAAs and gallium precursor are introduced into the growth chamber via an H$_2$ carrier gas directed onto the substrate at a flow rate in the range 0.1–20 SCCM. The result is selective epitaxial growth of gallium arsenide on the semiconductor surface at a rate on the order of 200 angstroms/min.

The resulting structure is schematically illustrated in FIG. 3. As can be seen, the growth layer 14 is selectively formed on the semiconductor layer 13 and not on the mask layer 11. If desired the mask layer 11 can be selectively removed, as by dissolving silicon nitride in hot phosphoric acid.

This process using DAAAs has many advantages over the prior use of arsine as an arsenic precursor. DAAAs have no arsenic-hydrogen bonds which reduce their toxicity as compared with arsine. DAAAs provide selective growth of material with low carbon content over a wider range of growth temperatures than arsine. In particular they provide selective growth at low temperatures ($\leq 600°$ C.) desirable for the fabrication of semiconductor electronic and photonic devices.

Figure 4:
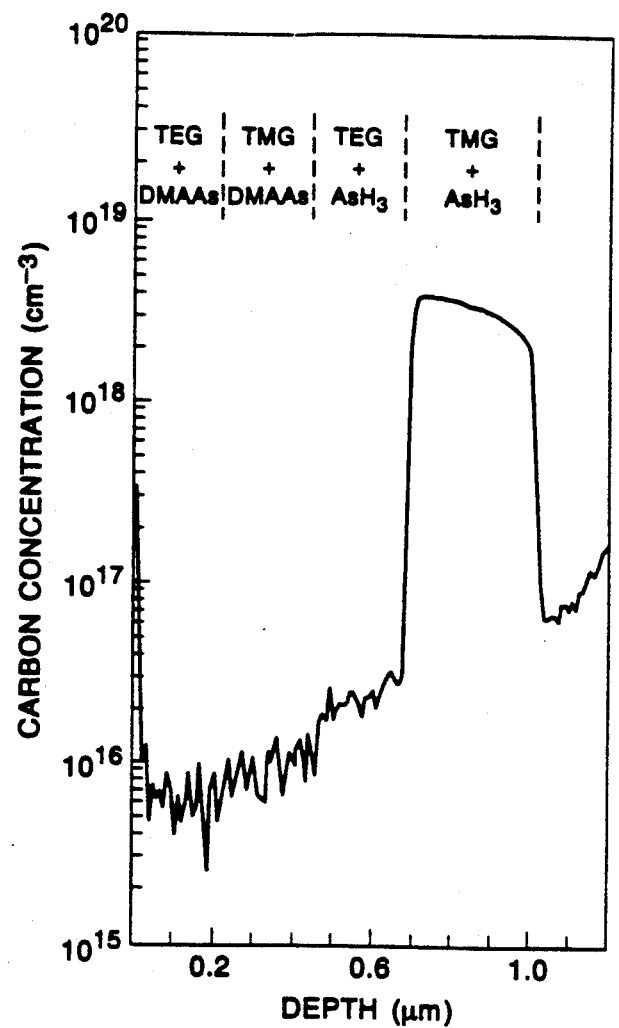
FIG. 4 is a graphical illustration of measured concentration versus depth showing the carbon gettering effect of the inventive method.

DAAAs are particularly useful in growing n-type and high resistivity layers of gallium arsenide and aluminum gallium arsenide because of their carbon "gettering" properties. For gallium arsenide materials carbon is a p-type dopant. Thus removal of carbon-containing impurities is important in the growth of n-type layers. DAAAs act as a carbon getterers because they decompose on the wafer surface leaving NR$_2$ groups free to recombine with carbon-containing groups to form volatile products. The results of this effect can be seen by reference to FIG. 4 which plots the concentration of various elements versus depth for successive layers grown using various precursors. As illustrated, growth with TMG and arsine resulted in a carbon level of about $2 \times 10^{18}$ cm$^{-3}$. By contrast, when the same flux of TMG was combined with DMAAs, the carbon content was reduced to about $8 \times 10^{15}$ cm$^{-3}$. Indeed it has been found that DMAAs is an excellecnt cleaning agent for III-V semiconductors of the gallium arsenide family, and cleaning can be effected by heating the semiconductor in an oxygen-free environment to a temperature in excess of 375° C. and exposing the semiconductor to DMAAs.

The invention can be understood in greater detail by consideration of the following specific example of the fabrication of a bipolar transistor. The structure is shown in FIG. 5 and details of the fabrication process are set forth in Table 1.

Figure 5:
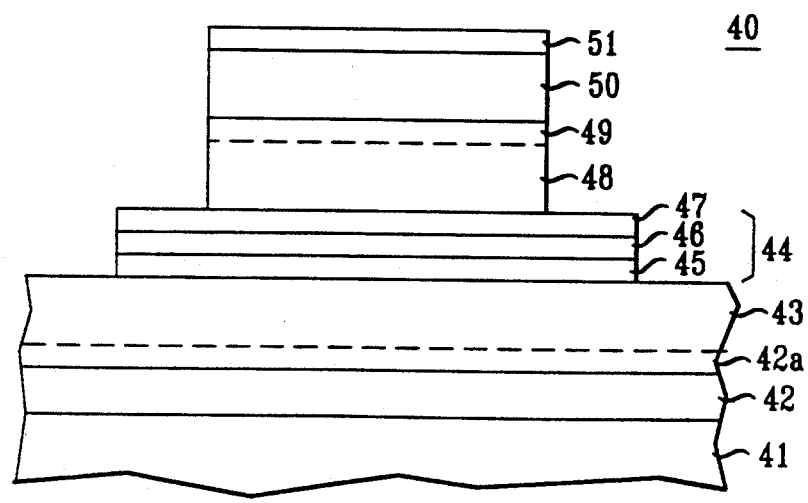
FIG. 5 is a schematic view of a preferred electronic device fabricated using the inventive method among the various fabrication steps.

FIG. 5 is a schematic view of a gallium arsenide device in the form of an "emitter-up" pnp transistor which can be advantageously fabricated using the inventive method. The device 40 depicted in FIG. 5 consists of a substrate 41 supporting successively grown layers 42, serving as transistor sub-collector, collector 43, and base region 44, in turn consisting of layers 45, 46, and 47. It is convenient to describe layer 46 as the functional base layer with embracing layers 45 and 47 (generally compositionally graded) serving as spacer regions (some in the art refer to the entirety of region 44 as the base region). Next, the emitter layer 48 is followed by optional layer 49 and finally by layers 50 and 51, the three layers constituting the emitter contact region.

Table 1 below sets forth in detail the processes used to make this principal layers of the device of FIG. 5. The term PhAs refers to phenylarsine, and the method of using PhAs to form an aluminum gallium arsenide layer is described in applicants' copending application entitled "Method for Selectively Growing Aluminum-Containing Layers" filed concurrently herewith.

Growth Temperature = 525° C.

| Layer (Time:Thickness) | Source | Source Temp | Carrier Gas Flow Rate | Bubbler Pressure (Torr) |
|---|---|---|---|---|
| 50 Emitter Contact (441 sec:2000 Å) | TMG | −9.4 | 5 | 60 |
| | AsH$_3$ | — | 5 | — |
| 49 Graded Layer (140 sec:200 Å) | TMG | −9.4 | 0.6 to 5 | 70 to 60 |
| | TMAA | 9.2 | 7 to 0 | 7 |
| | PhAs | 17 | 20 | 9.2 |
| 48 Emitter (800 sec:800 Å) | TMGA | −9.4 | 0.6 | 70 |
| | TMAA | 9.2 | 7.0 | 7 |
| | PhAs | 17 | 20 | 9.2 |
| 47 Base (220 sec:100 Å) | TMGa | −9.4 | 0.6 | 70 |
| | TMAAl | 9.2 | 7.0 | 70 |
| | DMAAs | 17 | 20 | 9.2 |
| 46 Base (26 sec:35 Å) | TMGa | −9.4 | 0.6 | 70 |
| | TDAAs | 17 | 20 | 9.2 |
| 45 Base (300 sec:700 Å) | TMGa | −9.4 | 1.2 | 70 |
| | TESn | −6.7 | 2.5 | 6.0 |
| | DMAAs | 17 | 20 | 9.2 |
| 44 Collector (2000 sec:4000 Å) | TMGa | −9.4 | 4.0 | 70 |
| | DMAAs | 17 | 20 | 9.2 |
| | AsH$_3$ | — | 5.0 | — |
| 42 Sub-collector (882 sec:4000 Å) | TMGa | −9.4 | 5.0 | 60 |
| | AsH$_3$ | — | 4.0 | — |

It is to be understood that the above-described embodiments are illustrative of only a few of the many possible specific embodiments which can represent applications of the principles of the invention. Numerous and varied other arrangements can be devised by those skilled in the art without departing from the spirit and scope of the invention.

We claim:

1. A MOMBE process for selectively growing gallium arsenide on unmasked portions of a masked workpiece comprising the steps of:
   providing a workpiece including a surface layer of III-V semiconductor material of the gallium arsenide family and further comprising a mask covering a portion of said surface layer while exposing selected portions;
   heating said workpiece in a reduced pressure environment to a temperature in the range 500° C. to 600° C.;
   exposing said workpiece to trimethylgallium and a gaseous dialkylaminoarsenic so as to selectively grow a layer of gallium arsenide on said selected portions of said surface layer.

2. The method of claim 1 wherein said dialkylaminoarsenic comprises trisdimethylaminoarsenic.

3. The method of claim 1 wherein said gallium arsenide grown on said selected portions of said surface layer is n-type gallium arsenide.

4. The method of claim 1 wherein said gallium arsenide grown on said selected portions of said surface layer is high purity gallium arsenide having a carbon level less than $2 \times 10^{18}$ cm$^{-3}$.

* * * * *